(12) United States Patent
Taylor et al.

(10) Patent No.: US 12,525,735 B2
(45) Date of Patent: Jan. 13, 2026

(54) HIGH PERFORMANCE INTERPOSER AND CHIP SOCKET HAVING CONTACTS WITH AN OUTER BEAN AND AN INNER BEAM

(71) Applicant: Amphenol Corporation, Wallingford, CT (US)

(72) Inventors: Paul R. Taylor, Mechanicsburg, PA (US); Jim Hileman, Carlisle, PA (US); Trent K. Do, Lititz, PA (US)

(73) Assignee: Amphenol Corporation, Wallingford, CT (US)

( * ) Notice: Subject to any disclaimer, the term of this patent is extended or adjusted under 35 U.S.C. 154(b) by 525 days.

(21) Appl. No.: 17/983,107

(22) Filed: Nov. 8, 2022

(65) Prior Publication Data

US 2023/0156917 A1  May 18, 2023

Related U.S. Application Data

(60) Provisional application No. 63/278,557, filed on Nov. 12, 2021.

(51) Int. Cl.
*H01R 13/24* (2006.01)
*H01L 23/498* (2006.01)
(Continued)

(52) U.S. Cl.
CPC ... *H01R 13/2435* (2013.01); *H01L 23/49838* (2013.01); *H01R 12/00* (2013.01);
(Continued)

(58) Field of Classification Search
CPC .... H01R 13/2435; H01R 12/00; H01R 12/51; H01R 12/55; H01R 12/714;
(Continued)

(56) References Cited

U.S. PATENT DOCUMENTS

| 6,533,613 B1 | 3/2003 | Turner et al. |
| 6,905,343 B1 | 6/2005 | Neidich |

(Continued)

FOREIGN PATENT DOCUMENTS

| CN | 103545659 A | 1/2014 | |
| CN | 110416761 A | * 11/2019 | ............. H01R 12/57 |

(Continued)

OTHER PUBLICATIONS

[No Author Listed], M-Series—10152299-191ULF. Amphenol Communications Solutions. 2023. 2 pages. URL:https://www.amphenol-cs.com/m-series-10152299191ulf.html. [Last accessed Jan. 9, 2023].

(Continued)

*Primary Examiner* — Justin M Kratt
(74) *Attorney, Agent, or Firm* — Wolf, Greenfield & Sacks, P.C.

(57) ABSTRACT

An interposer configured for connecting offset arrays of signal pads on parallel surfaces. Contacts of the interposer have mating portions with multiple beams. One of the beams makes contact with a pad on a first of the surfaces and is deflected when the surfaces are pressed together with the interposer between them. A second of the beams is positioned so that the first beam presses into that second beam as the first beam deflects. The second beam may contact a central location on the first beam. An electrical path through the contact from a pad on the first surface to a pad on the second surface may be shorter when the first beam is pressed into the second beam than through the first beam alone. A shorter path may improve signal integrity. Moreover, the spring force of the contact may be set by the second beam.

20 Claims, 12 Drawing Sheets

(51) Int. Cl.
  *H01R 12/00* (2006.01)
  *H01R 12/51* (2011.01)
  *H01R 12/55* (2011.01)
  *H01R 12/71* (2011.01)
  *H01R 12/57* (2011.01)
  *H01R 12/58* (2011.01)
  *H01R 33/74* (2006.01)
  *H05K 1/18* (2006.01)

(52) U.S. Cl.
  CPC ............ *H01R 12/51* (2013.01); *H01R 12/55* (2013.01); *H01R 12/714* (2013.01); *H01R 13/2457* (2013.01); *H01R 12/57* (2013.01); *H01R 12/58* (2013.01); *H01R 12/585* (2013.01); *H01R 12/71* (2013.01); *H01R 12/712* (2013.01); *H01R 13/24* (2013.01); *H01R 13/2414* (2013.01); *H01R 13/2464* (2013.01); *H01R 13/2485* (2013.01); *H01R 33/74* (2013.01); *H05K 1/181* (2013.01); *H05K 2201/10621* (2013.01); *H05K 2201/10628* (2013.01)

(58) Field of Classification Search
  CPC .... H01R 13/2457; H01R 12/57; H01R 12/58; H01R 12/585; H01R 12/71; H01R 12/712; H01R 13/24; H01R 13/2414; H01R 13/2464; H01R 13/2485; H01R 33/74; H01L 23/49838; H05K 1/181; H05K 2201/10621; H05K 2201/10628
  See application file for complete search history.

(56) References Cited

U.S. PATENT DOCUMENTS

| | | | |
|---|---|---|---|
| 9,425,525 | B2 | 8/2016 | Walden et al. |
| 9,543,703 | B2 | 1/2017 | Horchler et al. |
| 10,116,080 | B1 | 10/2018 | Ju et al. |
| 10,135,199 | B1 | 11/2018 | Ju |
| 10,148,024 | B2 | 12/2018 | Ju et al. |
| 2021/0075140 | A1* | 3/2021 | Ho ............... H01R 13/2435 |

FOREIGN PATENT DOCUMENTS

| | | |
|---|---|---|
| EP | 1801924 A2 | 6/2007 |
| EP | 2873121 A1 | 5/2015 |
| JP | 6224706 B2 | 11/2017 |
| JP | 6615845 B2 | 12/2019 |

OTHER PUBLICATIONS

Taylor, High Performance Interposer, U.S. Appl. No. 17/972,388, filed Oct. 24, 2022.

* cited by examiner

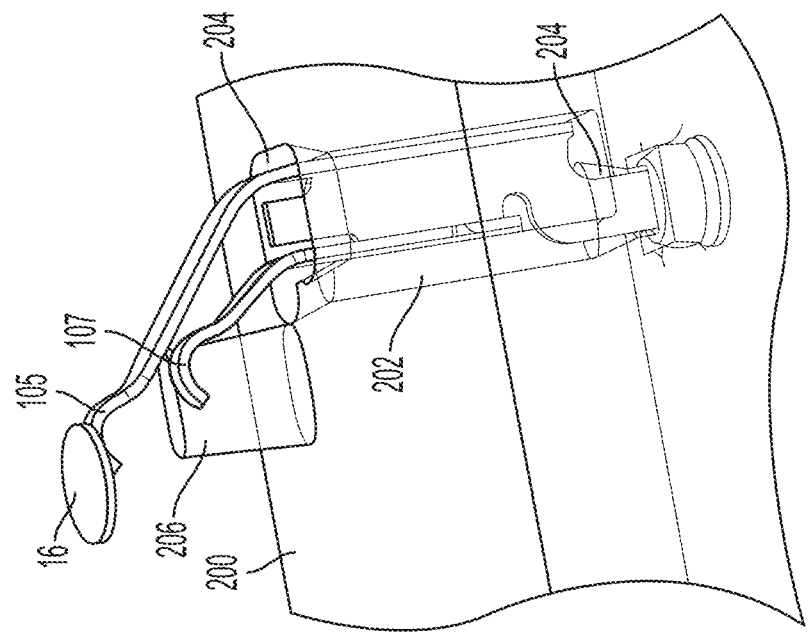
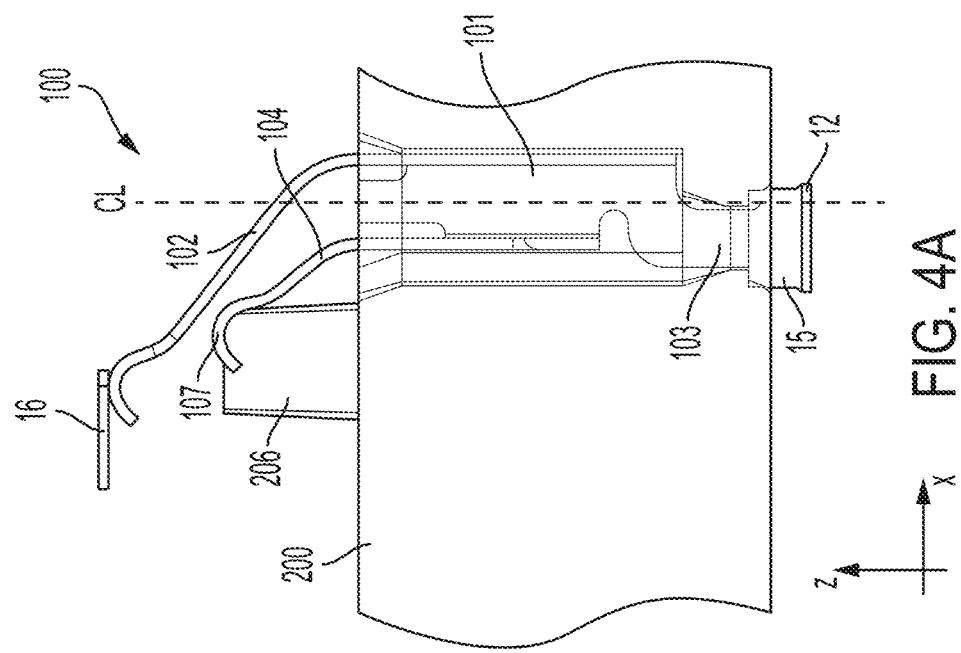
FIG. 4B
FIG. 4A

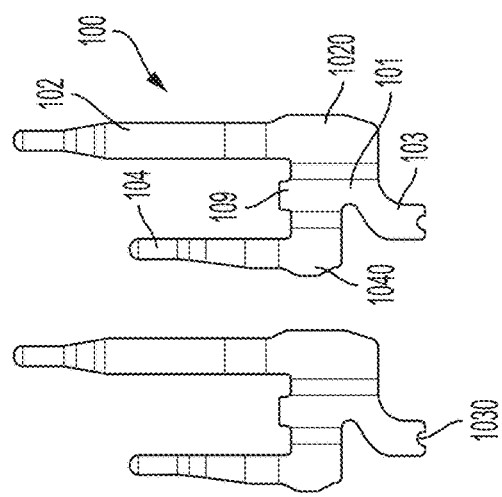
FIG. 5A
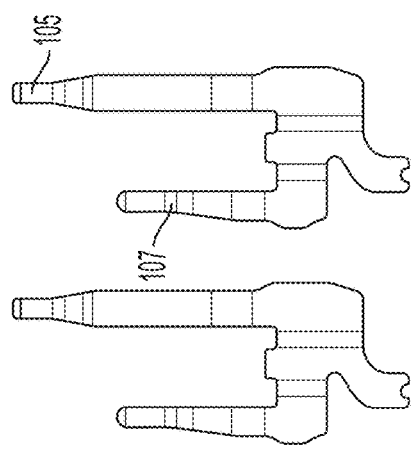
FIG. 5B
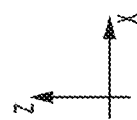

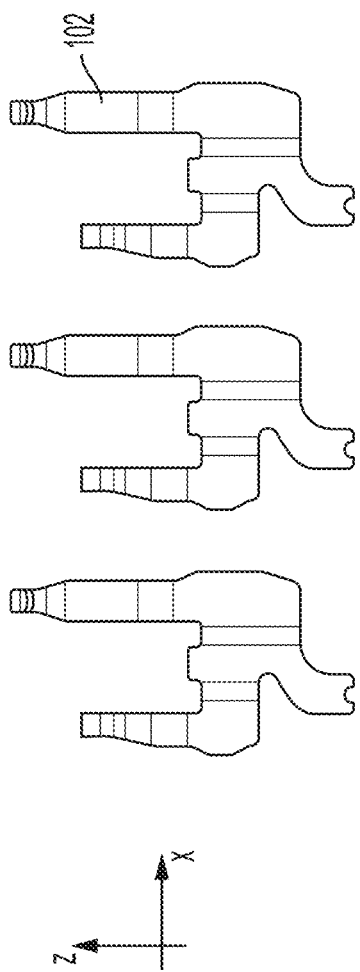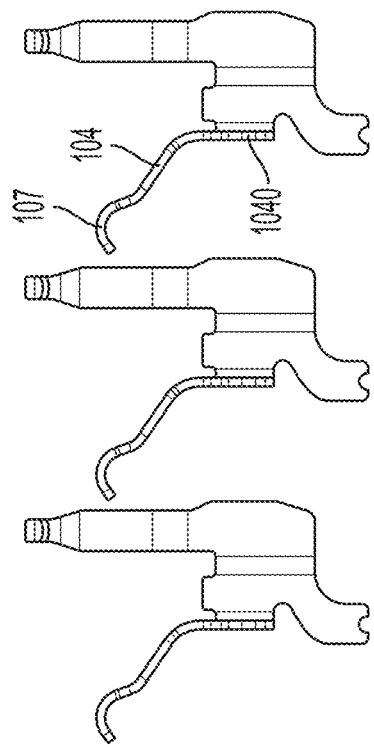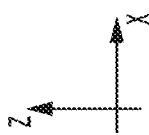
FIG. 5C
FIG. 5D

HIGH PERFORMANCE INTERPOSER AND CHIP SOCKET HAVING CONTACTS WITH AN OUTER BEAN AND AN INNER BEAM

RELATED APPLICATIONS

This application claims the benefit of U.S. Provisional Application Ser. No. 63/278,557, filed on Nov. 12, 2021, entitled "HIGH PERFORMANCE INTERPOSER AND CHIP SOCKET," which is hereby incorporated herein by reference in its entirety.

BACKGROUND

This patent application relates generally to interconnection systems and more particularly to systems with interposers that provide multiple electrical connections between components, including sockets providing multiple connections between a semiconductor chip and a printed circuit board.

Electronic systems are frequently assembled by integrating components that each performs specific functions, such as processors, memories, transceivers or other communications interfaces. Such an approach enables different component manufacturers to specialize in the design and manufacture of their components, leading to better performing components. Further, using the same components in multiple electronic systems enables mass production of each component, which provides economies of scale.

Interconnections between components in an electronic system are often provided by a printed circuit board (PCB), which contains multiple layers of conductive structures, including signal traces that can pass electrical signals from one location on the printed circuit board to another. Connections may be made to the conductive structures inside the PCB using holes, drilled fully or partially through the board and then plated with metal. These plated holes, sometimes called vias, are electrically connected to conductive structures within the board through which the holes pass. Connection points on the components, sometimes called leads, might also be connected to the vias, completing a connection between the component and the traces or other conductive structures in the PCB. Connection between leads of the component and the vias might be made, for example, by inserting the lead into the via or by forming a pad on the surface of the PCB on top of the via and connecting the lead to the pad.

Connections between the lead on the component and the via may be made in various ways, such as by using solder or by shaping the contact to generate a spring force on the via or a pad attached to the via. In some systems, a component may be attached to a PCB through a socket. The socket has contacts that are connected at a mounting portion to the vias on the PCB and mating portions at the other end that are connected to leads on a component. In some instances, the lead on the component may be a pad on a surface of the component and the mating portions of the contacts of the socket may be compliant so that they exert a force against the pads when the component is pressed into the socket. The socket may include latching structures to hold the component in the socket and press it against the mating portions of the contacts.

A socket may include an interposer, which is a component that can make multiple connections between a printed circuit board and a component pressed against the interposer. Interposers may be made with molded plastic housings and metal contacts inserted in passages in the housing. Interposers may be attached to the printed circuit board in any of multiple ways. For example, solder balls may be attached to the mounting portions of the contacts and the interposer may be attached to the PCB in a reflow solder operation. In other interposers, the mounting portions of the contacts may be spring fingers designed to press against pads on a surface of the PCB. Screws, or other hold down structures may ensure that the interposer is pressed against the PCB so that the spring fingers are compressed and generate a desired contact force.

The contacts in the interposer are frequently positioned in an array with mounting portions aligned with pads on the PCB and mating ends aligned with pads on the component being connected to the PCB. Each contact may carry a signal or be connected to ground. The pattern of the contacts in the array, and their function as signal or ground conductors, may be selected to provide good integrity of signals passing through the interposer. Signal carrying contacts, for example, may be positioned between ground contacts. Also, the signal carrying contacts may be positioned in pairs that carry differential signals. However, constraints, such as the position or function of the pads on the PCB or on the component pressed into the interposer may preclude an arbitrary positioning of signal and ground contacts.

In some electronic systems, a semiconductor device, such as a processor, may have an array of pads that has the same number of pads and the same relative positioning of pads as an array of pads on a printed circuit board to which that semiconductor device is to be mounted. A socket for that semiconductor device may have contacts positioned within the housing such that the mounting portions of the contacts align with the pads on the PCB. Those contacts may have intermediate portions extending through the housing in a direction perpendicular to the surface of the PCB. For those contacts to make an electrical connection to the offset array of pads on the semiconductor device, the mating portions of the contact must extend in a direction perpendicular to the intermediate portions. The extending mating portions may act as compliant beams that generate a mating force when the semiconductor device is pressed into the socket.

SUMMARY

Some embodiments relate to a contact for an interposer, the contact comprising: an intermediate portion elongated in a first direction; and a plurality of beams coupled to the intermediate portion. Each of the plurality of beams is elongated in a direction transverse to the first direction. A first beam of the plurality of beams comprises a first contact surface facing in the first direction. A second beam of the plurality of beams comprises a second contact surface facing in the first direction. The first beam and the second beam are in a plane parallel to the first direction with the second contact surface within the working range of the first beam such that the first beam is adapted to contact the second beam upon deflection of the first beam.

In some embodiments, the first contact surface is separated from the second contact surface by a distance along the first beam between 10% and 50% of the length of the first beam.

In some embodiments, the first beam is between 110% and 200% of the length of the second beam.

In some embodiments, the second beam has a spring constant between 110% and 200% of the spring constant of the first beam.

In some embodiments, the contact further comprises a mounting portion extending from the intermediate portion in a second direction opposite the first direction.

In some embodiments, the contact comprises a bent sheet of metal; and the mounting portion comprises an edge of the sheet of metal with a notch.

In some embodiments, the intermediate portion has a first side and a second opposite side, and the contact further comprises: a first base portion perpendicular to the intermediate portion at the first side; and a second base portion perpendicular to the intermediate portion at the second side; the first beam extends from the first base portion; and the second beam extends from the second base portion.

In some embodiments, the first base portion is attached to the first side of the intermediate portion; and the second base portion is attached to the second side of the intermediate portion.

In some embodiments, the contact further comprises a strap connecting the first base portion and the second base portion.

In some embodiments, the first base portion is attached to the first side of the intermediate portion.

In some embodiments, the first contact surface comprises a convex surface of a curved portion of the first beam; and the second contact surface comprises a convex surface of a curved portion of the second beam.

Some embodiments relate to an interposer comprising an insulative member comprising a first surface and a second, opposite surface; a plurality of contacts of any of the preceding claims, wherein the intermediate portion of each of the plurality of contacts is held within the insulative member with a mounting portion of the contact exposed at the first surface and the first contact surface exposed at the second surface.

In some embodiments, a third beam of the plurality of beams comprises a third contact surface facing in a second direction opposite the first direction; a fourth beam of the plurality of beams comprises a fourth contact surface facing in the second direction; and the fourth contact surface is within the working range of the third beam such that the third beam is adapted to contact the fourth beam upon deflection of the third beam.

Some embodiments relate to an interposer comprising an insulative member comprising a first surface and a second, opposite surface; a plurality of contacts comprising ends exposed at the first surface and mating portions exposed at the second surface. The mating portion of each of the plurality of contacts comprise a plurality of beams. A first beam of the plurality of beams comprises a contact surface facing in a first direction perpendicular to the second surface and a second surface, facing opposite the contact surface. A second beam of the plurality of beams aligned with the first beam in the first direction and disposed between the first beam and the insulative member.

In some embodiments, the ends of the plurality of contacts are disposed in a first array; the mating portions of the plurality of contacts are disposed in a second array; the second array is offset from the first array in a second direction parallel to the first surface.

In some embodiments, the plurality of contacts comprise intermediate portions connecting the ends and the mating portions; and the insulative member comprises a plurality of holes extending from the first surface to the second surface; the intermediate portions of the plurality of contacts are disposed within the holes; and the insulative member comprises a plurality of openings in the first surface, wherein the openings open into the holes and are configured to receive respective second beams when the second beams are deflected towards the insulative member.

In some embodiments, the insulative member comprises a plurality of projections projecting from the second surface adjacent mating portions of at least a portion of the plurality of contacts.

In some embodiments, the plurality of projections adjacent the portion of the plurality of contacts comprise lossy material.

In some embodiments, the mating portions are exposed at the second surface in a plurality of rows; and each contact of the portion of the plurality of contacts is separated along the row from an adjacent contact of the portion by at least two contacts of the plurality of contacts.

In some embodiments, the interposer further comprises a conductive member positioned to contact a portion of the plurality of contacts when the mating portions of the portion of the plurality of contacts are in at least one of a compressed or uncompressed state.

In some embodiments, the mating portions are exposed at the second surface in a plurality of rows; and the interposer further comprises a conductive member comprising a first portion, elongated parallel to a row and a plurality of tabs; and each of the plurality of tabs extends towards a mating portion of a contact.

In some embodiments, the ends of the plurality of contacts comprise mounting portions.

Some embodiments relate to an electronic assembly comprising a printed circuit board comprising a first surface with a first array of pads disposed thereon; a device comprising a second surface, facing the first surface and with a second array of pads disposed thereon, wherein the second surface is spaced from the first surface in a first direction; an interposer between the first surface and the second surface. The interposer comprises a plurality of contacts comprising a first portion extending in the first direction and a second portion extending in a second direction, orthogonal to the first direction. The second portion comprises a first beam comprising a contact surface, a base end coupled to the first portion and an intermediate portion between the contact surface and the base end; and a second beam comprising a contact surface disposed adjacent the intermediate portion of the first beam and a base end coupled to the first portion.

In some embodiments, the second array is offset from the first array in the second direction.

In some embodiments, the interposer further comprises a housing; the housing comprises an insulative portion; and the first portions of the plurality of contacts are held within the insulative portion and the first beams of the plurality of contacts extend out of the insulative portion.

In some embodiments, the plurality of contacts are disposed in a plurality of rows; the housing of the interposer further comprises at least one lossy region comprising a first portion extending along a first row of the plurality of rows and a plurality of second portions, each of the plurality of second portions extending from the first portion toward a contact of the plurality of contacts within the first row.

In some embodiments, the at least one lossy region comprises a plurality of lossy regions, each of the lossy regions comprising a first portion extending along a respective row of the plurality of rows and a plurality of second portions, each of the plurality of second portions extending from the first portion toward a contact of the plurality of contacts within the respective row.

In some embodiments, the second portions extend toward every third contact of the plurality of contacts within the respective row.

In some embodiments, the printed circuit board comprises at least one ground plane; and the second portions extend toward contacts of the plurality of contacts within the respective row that are connected to the at least one ground plane.

In some embodiments, the contacts within each of the plurality of rows are arranged in a ground, signal, signal ground (SGS) pattern; and the second portions selective extend toward the ground contacts.

In some embodiments, the plurality of contacts are disposed in a plurality of rows; the interposer further comprises at least one conductive member comprising a first portion extending along a first row of the plurality of rows and a plurality of second portions, each of the plurality of second portions extending from the first portion toward a contact of the plurality of contacts within the first row.

In some embodiments, the at least one member comprises a plurality of conductive members, each of the conductive members comprising a first portion extending along a respective row of the plurality of rows and a plurality of second portions, each of the plurality of second portions extending from the first portion toward a contact of the plurality of contacts within the respective row.

In some embodiments, the second portions extend toward every third contact of the plurality of contacts within the respective row.

In some embodiments, the printed circuit board comprises at least one ground plane; and the second portions extend toward contacts of the plurality of contacts within the respective row that are connected to the at least one ground plane.

In some embodiments, the contacts within each of the plurality of rows are arranged in a ground, signal, signal, ground (GSSG) pattern; and the second portions selective extend toward the ground contacts.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 4A-4B are a side view and a perspective view, respectively, of a contact having a pair of compliant beams, in accordance with some embodiments.

FIGS. 5A-5E are top plan views illustrating representative steps for fabricating an array of contacts, in accordance with some embodiments.

DESCRIPTION OF PREFERRED EMBODIMENTS

Figure 1B:
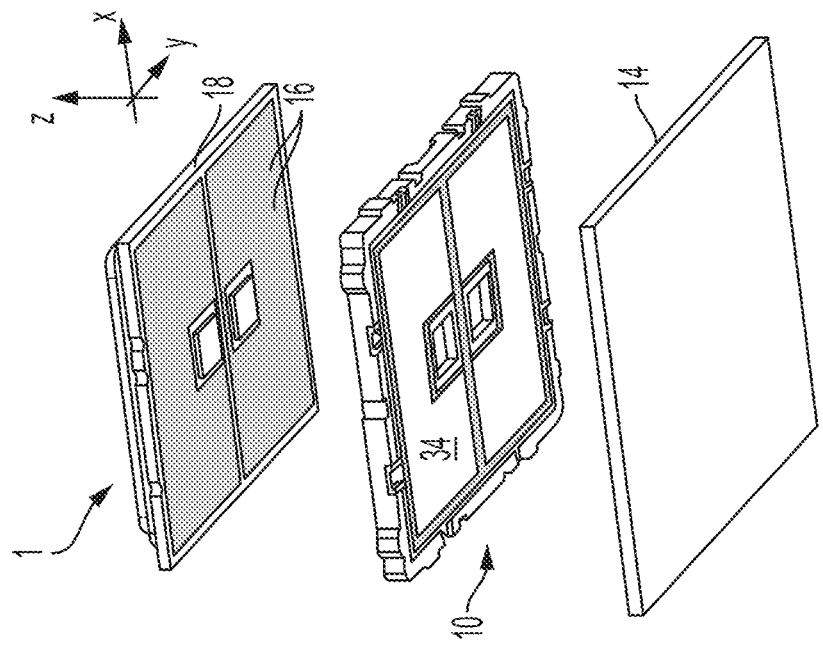
FIGS. 1A-1B are exploded perspective views of an electronic assembly including an interposer, in accordance with some embodiments.

The inventors have recognized and appreciated techniques for making an interposer that supports electrical connections through the interposer with high signal integrity while simultaneously meeting the mechanical requirements for a high density of reliable interconnects. Those interposers may enable high integrity connections between arrays of contact points on a printed circuit board (PCB) and a component that is offset in a direction parallel to the surface of the PCB. Such interposers may have contacts with mating portions with multiple compliant beams that extend at an angle relative to intermediate portions of the contacts that extend through a housing of the interposer.

An interposer may include an array of contacts, each contact providing an electrical path from the component to the PCB passing through the interposer. Each contact may include multiple beams. The beams may contact each other when a component is pressed onto the interposer. An outer beam, closer to the component pressed onto the interposer than an inner beam, for example, may contact a lead or a pad on the component. As the component is pressed onto the interposer, the outer beam may deflect towards and touch an inner beam. The length and shape of the compliant beams, as well as the housing adjacent the beams, may be configured such that desirable mechanical and signal integrity properties are achieved.

The beams may be designed to provide a desired mechanical performance. In some embodiments, the beams may be shaped to provide a significant amount of mechanical wipe, whereby the inner beam and the outer beam slide against each other while keeping in contact to each other as the component is pressed further onto the interposer. For example, the inner beam may define a convex surface facing the outer beam positioned so that, as the component is pressed further onto the interposer, the convex surface slides against the outer beam while keeping in contact with the outer beam. Designing a contact to provide significant mechanical wipe leads to a more reliable electrical connection between the inner and outer beams, which, in turn, provides better signal integrity.

Further, the outer beam and the inner beam may have different spring constants such that the combined spring constant of the compliant portions of the contact can be set to generate a desired force. Such a contact may be designed with an outer beam that has a length suitable to make connections between a first array of pads on a printed circuit board and a second array of pads on the component that are offset relative to each other in a direction parallel to a surface of the printed circuit board. The inner beam may have a shorter dimension, which can be independent of the offset between the arrays of pads on the PCB and the component, to provide desired mechanical properties (e.g., the desired spring constant). Controlling the aggregate spring constant of the inner and outer beams together may ensure reliable electrical connection between the contacts and one or more of the components connected through the interposer. In some embodiments, an outer beam and inner beam may be configured to provide, in aggregate, a contact force between 20 grams force and 30 grams or between 15 gram and 25 grams, for example.

The beams may be designed to provide a desired electrical performance. The inner beam, for example, may be shorter than the outer beam. In this configuration, the inner beam may provide an electrical path from the contact surface of the outer beam to the mounting portion of the contact that is shorter than the electrical path through the outer beam. The electrical length of the contact may thus be shorter, thereby reducing the overall contact impedance, which can improve signal integrity.

In some embodiments, the inner and outer beams may be formed as part of a unitary piece of conductive material. As such, a contact may be a unitary piece including an intermediate portion, where the inner and outer beams are attached to, and extend away from, the intermediate portion. Forming a pair of compliant beams to be part of a unitary piece may lead to one or more benefits with respect to arrangements in which beams are formed as separate pieces. Forming a pair of compliant beams to be part of a unitary piece may reduce the negative effects resulting from electrical resonances. Resonances are standing waves that may be excited between conductive structures at particular frequencies. Resonances are undesirable because they can lead to signal insertion loss and/or crosstalk at the frequency of the resonance, thus effectively limiting the highest data rate that can be transmitted through the contact with an acceptable noise level. Constructing multiple compliant beams as part of a unitary piece may increase the frequencies of such resonances, as compared to constructing the beams as separate elements, thereby extending the highest data rate that can be transmitted through the contact with an acceptable noise level.

Constructing the compliant beams to be part of a unitary piece also may provide a better thermal performance. The additional conductive material required to connect the compliant beams to one another provides a conductive path that can prevent the formation of hot spots. These benefits may be achieved in a contact that may also be easily manufactured. Arrays of such contacts may be fabricated, for example, by stamping a sheet of conductive material with a predefined shape numerous times and by folding the stamped shapes to provide the desired geometry.

An interposer may include an insulative housing designed to hold an array of contacts. In some embodiments, the housing of the interposer may include features to provide a desired mechanical performance. Mouths of the openings through which the contacts pass may be enlarged, relative to the size of the contact, to reduce the spring constant of the inner beam, for example. Projections to prevent overstressing of the compliant beams may also be formed as part of the housing.

In some embodiments, the interposer may include features to provide a desired electrical performance. These features may include structures positioned preferentially with respect to the ground contacts. As an example, conductive or lossy structures may be preferentially positioned adjacent to the ground contacts. The ground contacts may contact these structures. In some embodiments, the structures may be positioned such that, when the compliant beams of the ground contacts deflect as a result of a component being pressed onto the interposer, the compliant beams may be pressed against these conductive or lossy structures. In this way, the conductive or lossy structures may attenuate the negative effects produced by the formation of resonances. For example, conductive or lossy structure contacting a ground contact may reduce the quality factor (Q) of the resonance associated with the contact and/or may shift the resonant frequency to larger frequencies.

Figure 1A:
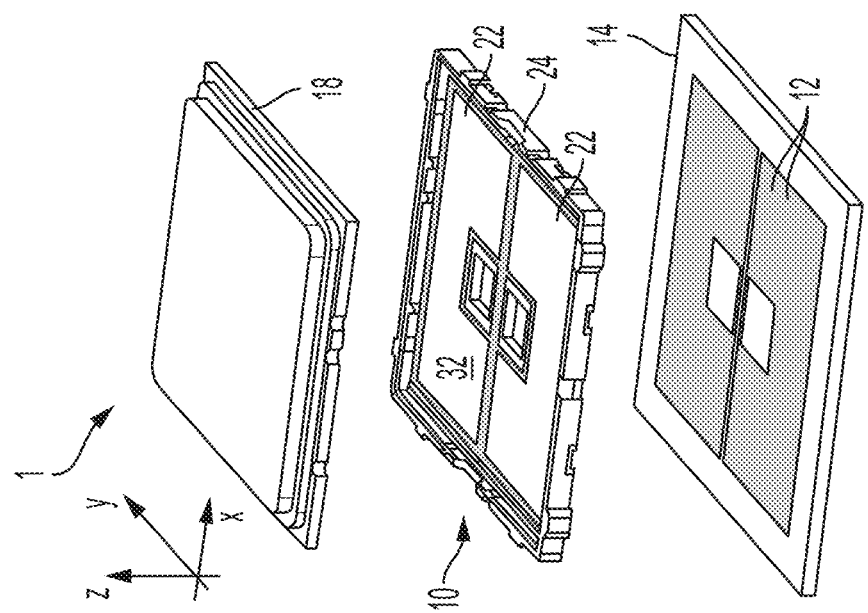

FIGS. 1A-1B are perspective views of an electronic assembly including an interposer, in accordance with some embodiments. The interposer, for example, may be a portion of a chip socket, connecting a semiconductor ship to a printed circuit board of the electronic assembly. FIG. 1A is a top perspective view and FIG. 1B is a bottom perspective view, respectively, of an electronic assembly 1. Electronic assembly 1 includes a substrate 14, an interposer 10 and a component 18. In some embodiments, substrate 14 may be arranged as a PCB (e.g., a motherboard), interposer 10 may be arranged as a chip socket and component 18 may be arranged as a semiconductor chip (e.g., a processor chip, a memory chip or a transceiver chip). Electronic assembly 1 may be arranged such that the electrical interface of substrate 14 is in a plane parallel to the plane in which the electrical interface of component 18 is defined. Interposer 10 may be mounted to substrate 14, and electrical connections may be formed via soldering, Ball Grid Array (BGA), Land Grid Array (LGA) or any other suitable means. For example, interposer 10 may include mounting portions at the bottom side 34 of interposer 10. In the illustrated example, the mounting portions are soldered to respective pads 12 of substrate 14, such as with BGA-type surface mount soldering techniques. In other configurations, however, the mounting portions may form pressure contacts as a result of interposer 10 being pressed against substrate 14 by mechanical components.

To make connections between component 18 and substrate 14, component 18 may be pressed into the top surface 32 of interposer 10. Interposer 10 may include latching structures designed to hold component 18 to the interposer (inside frame 24) and to press the component against the mating portions of the contacts of the interposer. Mechanical components to generate force to press component 18 against interposer 10 are not expressly illustrated. However, mechanical components, which may be fixed to substrate 14, may exert a force on component 18 in a direction towards substrate 14.

FIGS. 1A and 1B include legends illustrating orthogonal X, Y and Z directions. In this example, the substrate 14 has a generally planar surface disposed in the X-Y plane. The X-Y plane may be referred to as the horizontal direction. Interposer 10 may have a mounting interface, configured for attachment to a substrate 14. The attachment interface may define the horizontal direction for the interposer, whether or not attached to a substrate. In the illustrated configuration, interposer 10 has a mating interface, configured to make a separable connection with a component 18. That mating interface also extends in a horizontal plane. In this example, component is pressed in the Z direction, which may also be referred to as the vertical direction, for mating with interposer 10. It should be appreciated that the X, Y, Z legend is included to indicate relative orientations of components in different views, and not as a limitation of how the components may be mounted within an electronic system.

In the illustrated example, pads 16 are formed on the bottom surface of component 18. The mating portions of the contacts of the interposer 10 may be compliant so that they exert a force against these pads when the component is pressed and held into the interposer. The contacts of the interposer may be positioned in the mating region 22. For simplicity of illustration, only a portion of mating region 22 is shown with contacts. However, an array of contacts may extend over the entire mating region 22, which may extend or substantially all, or any suitable portion of, the surface of interposer 10.

Figure 2A:
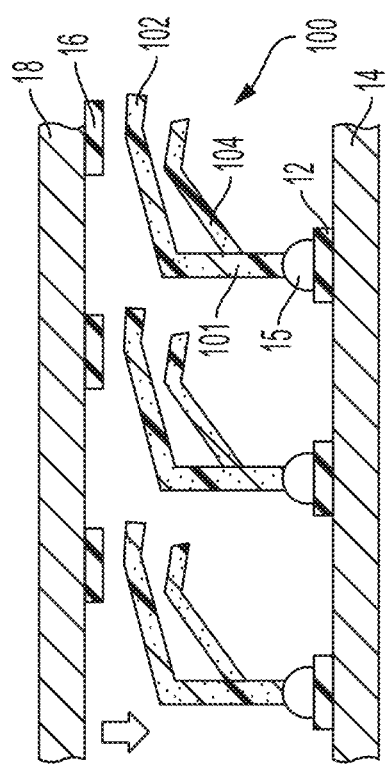
FIGS. 2A-2B are cross sectional side views of an interposer in an uncompressed state and in a compressed state, respectively, in accordance with some embodiments.
Figure 2B:
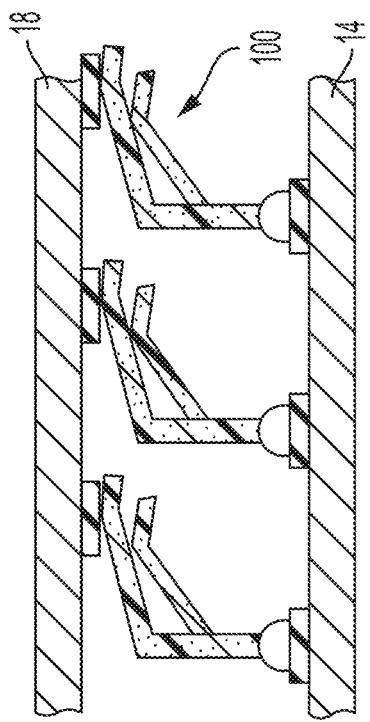

FIGS. 2A-2B are cross sectional side views illustrating a portion of an array of contacts 100 of an interposer 10, in accordance with some embodiments. In the depiction of FIG. 2A, component 18 is unmated from interposer 10—there are gaps separating contacts 100 from pads 16.

This depiction illustrates an uncompressed state. In the depiction of FIG. 2B, on the other hand, component 18 is mated to interposer 10—contacts 100 touch pads 16. This depiction illustrates a compressed state. Contacts 100 may be supported by a housing of the interposer (not shown in FIGS. 2A-2B).

Contacts 100 are multi-beam contacts. In the illustrated example, each contact 100 includes an outer beam 102 and an inner beam 104, although additional beams are also possible in some embodiments. Outer beam 102 is closer to component 18 and inner beam 104 is positioned between outer beam 102 and substrate 14. The contacts may be formed as unitary pieces, with both beams of a contact attached to a common intermediate portion 101. Contacts 100 are connected to pads 12 (on substrate 14) via connections 15 (e.g., solder). When the contact is in the uncompressed state, the outer beam 102 does not contact inner beam 104 (other than through intermediate portion 101). As component 18 is pressed into interposer 10, force applied to the contact via the bottom surface of component 18 causes outer beams 102 to deflect in the downward direction, towards inner beams 104. As the body of the contact is compressed, a vertical force is generated against pad 16 due to the elastic force produced by the upper beam. As component 18 continues to press into interposer 10, the outer beams 102 deflect to the point of touching corresponding inner beams 104, as shown in FIG. 2B. Further compression causes the lower beams to slide across the upper beams, thereby creating wipe and improving the reliability of the connection. In the illustrated example, wipe may result from the inner beam and the outer beam being attached to the intermediate portion 101 differently such that, when the beams are pressed downwards, the contact surface on the lower beam moves away from the intermediate portion 101 a different amount than a corresponding point on the lower surface of the upper beam, creating wipe. Such differential motion, for example, may result from the inner beam and outer beam extending from the intermediate portion at different angles and/or having pivot points that are at different distances from the centerline of the intermediate portion. As will be described in connection with FIGS. 4A-4B, the lower beam includes a region having a convex surface facing the upper beam, which allows the beams to slide against each other smoothly.

When component 18 is pressed sufficiently against the contacts that both the inner beam and outer beam are deflected, the elastic force exerted against pad 16 depends upon the combined spring constants of the outer beam and the inner beam. Such an elastic force may be greater than the elastic force otherwise exerted by the outer beam alone.

Figure 3:
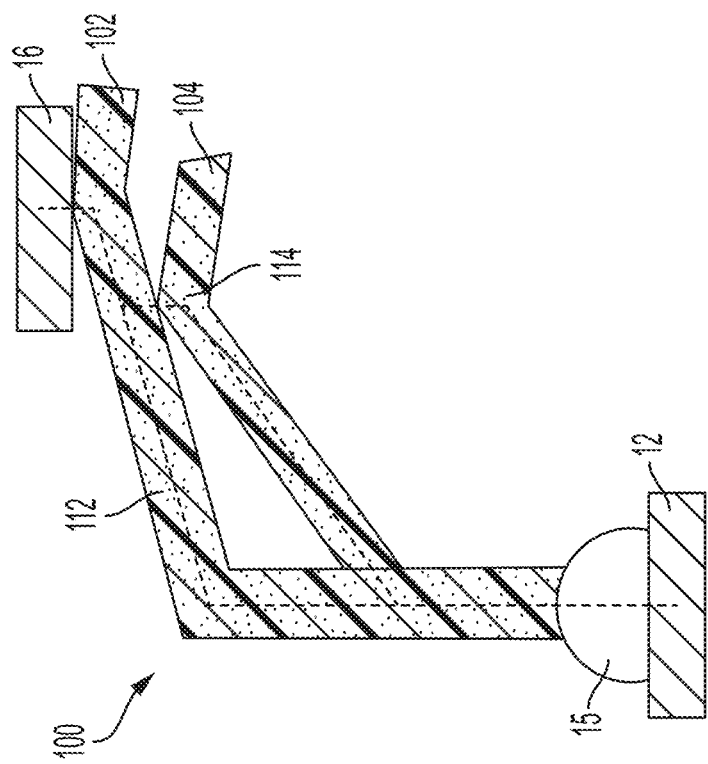
FIG. 3 is a side view of a contact in a compressed state, in accordance with some embodiments.

FIG. 3 illustrates a representative contact 100 in a compressed state, in accordance with some embodiments. When outer beam 102 touches inner beam 104 as a result of the compression, a second electrical path 114 is formed having a portion in parallel to a portion of the first electrical path 112. Both electrical paths extend from pad 16 to pad 12. In some embodiments, the second electrical path 114 is shorter than the first electrical path 112 as a result of inner beam 104 being shorter than outer beam 102. Accordingly, the impedance associated with the second electrical path 114 is lower than that associated with the first electrical path 112. The formation of an additional, shorter electrical path in parallel to the primary electrical path reduces the impedance of the contact, thereby improving signal integrity. In the compressed state, the vertical separation 117 between outer beam 102 and inner beam 104 (defined at the distal end of beam 117) may be between 0.030 mm and 0.1 mm, between 0.010 mm and 0.3 mm, between 0.030 mm and 0.3 mm or between 0.010 mm and 0.1 mm.

FIGS. 4A-4B are a side view and a perspective view, respectively, of a representative implementation of contact 100, in accordance with some embodiments. In this implementation, intermediate portion 101 passes through a hole 202 through an insulative member 200 of the interposer. Insulative member 200 may be a molded plastic component into which contacts are inserted and/or may be molded over portions of the contacts.

Though insulative member 200 is shown as a single piece, an interposer may be formed from multiple insulative elements that are held together in a frame or other support structure.

Hole 202 extends from the top surface of insulative member 200 to the bottom surface of insulative member 200. Hole 202 has a tapered region 204 near the bottom surface of insulative member 200 through which mounting portion 103 passes. Mounting portion 103 connects to pad 12 via connection 15. Connection 15 may be, for example, a solder ball or solder mass, which may be fused to mounting portion 103 and/or may be confined within a recess in a lower surface of insulative member 200.

The other end of hole 202 has an opening 204 at the upper surface of insulative member 200. Hole 202 enlarges closer to the top surface of insulative member 200. The shape of opening 204 may be chosen to provide sufficient room around the beams, thereby allowing the beams to deflect freely. Alternatively, or additionally, the shape of the opening 204 may be chosen to control the spring constant of the inner beam and/or outer beam.

For each contact of the array (or for at least some of the contacts), interposer 100 may include a projection 206 extending from insulative member 200 along the z-axis. Each projection 206 may be positioned adjacent to a corresponding lower beam 104. In some embodiments, the projections 206 may be shaped and positioned to prevent overstressing of the beams by acting as a stopper—they limit deflection of the beams by limiting the how close a component 18 can be pressed towards insulative member 200.

In some embodiments, some of the projections 206 may be filled, partially or entirely, with a conductive or lossy material. Lossy material, for example, may be a plastic filled with carbon fibers to provide a bulk conductivity of around 1 to 30,000 Siemens/meter, for example. In some embodiments, the bulk conductivity may average about 40 to 1,000 Siemens/meter. In some configurations, the projections near ground contacts may be filled with such a material, while the projections near the signal contacts may not. In this way, ground contacts may couple to the lossy material and the quality factor (Q) of the resonance associated with the ground contacts may reduce and/or the resonant frequency may shift to larger frequencies. As a result, signal integrity is further improved. To facilitate coupling to the lossy or conductive structures, the lossy or conductive structures may extend beyond the projections 206 to facilitate enhanced coupling, such as through direct contact or capacitive coupling.

Beams 102 and 104 are connected to, and project away from, intermediate portion 101. In this example, each of beams 102 and 104 is coupled to the intermediate portion 101 at a pivot point. The pivot points are offset from the centerline CL of the intermediate portion 101 by different amounts. In this example, the pivot points are on opposite sides of the centerline CL.

Further, beams 102 and 104 extend outside the top surface of insulative portion 200. Intermediate portion 101 is elongated along the z-axis, and the beams are elongated in a direction transverse to the z-axis. For example, the beams may lie in an xz-plane, and may be elongated in a direction that is at an angle relative to the z-axis that is between 25° and 75°, as an example. Each of the beams 1002 and 104 may make a different angle with respect to the Z axis. Beam 102, for example, may be bent at a larger angle than beam 104. The difference in angle, for example, may be between 2 and 30 degrees, such as in the range of 5 to 20 degrees. Such a configuration, with a different angle and/or different pivot point, may facilitate wipe as beams 102 and 104 are deflected towards insulative member 200.

In some embodiments, pad 16 is offset relative to pad 12 along the x-axis. In some embodiments, the length of outer beam 102 may be dictated by the lateral separation between pad 16 and pad 12, which may be set based on contact density requirements. As a result, it may not be possible to choose the length of the outer beam arbitrarily. The length of the inner beam, on the other hand, may not be constrained to cover the separation between pads 12 and 16. As a result, the length of the inner beam may be chosen freely, thus allowing the spring constant associated with the inner beam (and as a result, the overall spring constant associated with the contact) to be engineered as desired.

Outer beam 102 may comprises a contact surface 105 facing in the upwards direction along the z-axis (facing pad 16). Contact surface 105 may include a curved portion oriented so that the convex region faces pad 16 and the concave region faces inner beam 104. The presence of the convex region may allow the beam to slide against pad 16 smoothly, thereby providing for mechanical wipe (which improves the reliability of the contact-pad connection).

Inner beam 104 may be aligned, at least partially, with outer beam 102 along the z-axis. Inner beam 104 may comprise a contact surface 107 also facing in the upwards direction along the z-axis (facing outer beam 102). Contact surface 107 may be within the working range of the outer beam, such that the outer beam is adapted to contact the inner beam upon deflection of the outer beam. Contact surface 107 may include a curved portion oriented so that the convex region faces beam 102 and the concave region faces component 14. The presence of the convex region may allow the beams to slide against one another smoothly, thereby providing for mechanical wipe (which improves the reliability of the beam-beam connection). In some embodiments, the contact surface 105 is separated from the contact surface 107 by a distance along the outer beam between 10% and 50% of the length of the outer beam. In some embodiments, the outer beam is between 110% and 200% of the length of the inner beam. In some embodiments, the outer beam has a spring constant between 110% and 200% of the spring constant of the inner beam.

In the uncompressed state, the lateral separation 225 between the centerline of intermediate portion 101 and the centerline of contact surface 105 may be between 0.9 mm and 1.2 mm, between 0.6 mm and 1.5 mm, between 0.9 mm and 1.5 mm or between 0.7 mm and 1.2 mm. Further, in the uncompressed state, the lateral separation 227 between the centerline of intermediate portion 101 and the centerline of contact surface 107 may be between 0.8 mm and 1.1 mm, between 0.5 mm and 1.4 mm, between 0.8 mm and 1.4 mm or between 0.5 mm and 1.1 mm.

In some embodiments, arrays of such contacts may be fabricated by stamping a sheet of conductive material (e.g., metal) with a predefined shape numerous times and by folding the stamped shapes to provide the desired geometry. Different materials may be use for the conductive sheet, including copper alloys. In some embodiments, some or all of the surface area of the contacts may be plated with materials such as gold, silver, or nickel. Contact surfaces, for example, may be plated with gold or other metal resistant to oxidation.

FIGS. 5A-5E are top plan views illustrating representative steps for fabricating an array of contacts, in accordance with some embodiments. In the fabrication step corresponding to FIG. 5A, an array of three contacts has been stamped from a planar sheet of conductive material. In some implementations, the blanks for forming multiple contacts may be held together on a carrier strip to facilitate handling. A carrier strip may be cut off, once no longer useful. For simplicity of illustration, a carrier strip and assembly tooling are not expressly shown. At this stage, each contact includes an intermediate portion 101, from which mounting portion 103 extends in the downwards direction along the z-axis, and from which beams 102 and 104 extend in the opposite direction. The bottom edge of mounting portion 103 may be stamped with a notch 1030. The notch is shaped to facilitate bonding to connection 15 (in a subsequent fabrication step).

Beam 102 extends farther in the z direction from intermediate portion 101 than beam 104 does. Beam 102 connects to intermediate portion 101 at the base portion 1020. Similarly, beam 104 connects to intermediate portion 101 at the base portion 1040. Base portions 1020 and 1040 are positioned at opposite ends of intermediate portion 101 along the x-axis. The portion of the metal sheet in the region between beams 102 and 104 along the x-axis is removed in a stamping operation. Intermediate portion 101 includes a tab 109 between beam 102 and beam 104.

In the fabrication step leading to the state shown in FIG. 5B, the regions at or near the tips of the beams are formed into curved shapes. These curved regions define what ultimately become contact surfaces 105 and 107. Contact surface 105 is shaped so that the convex region faces into the plane of the page, along the y-axis. Contact surface 107 is shaped in the opposite direction—the convex region faces away from the plane of the page, along the y-axis.

In the fabrication step leading to the state shown in FIG. 5C, beam 102 (excluding base portion 1020) is bent away from the plane of the page along the y-axis. Further, beam 104 (excluding base portion 1040) is bent into the plane of the page along the y-axis.

Figure 5E:
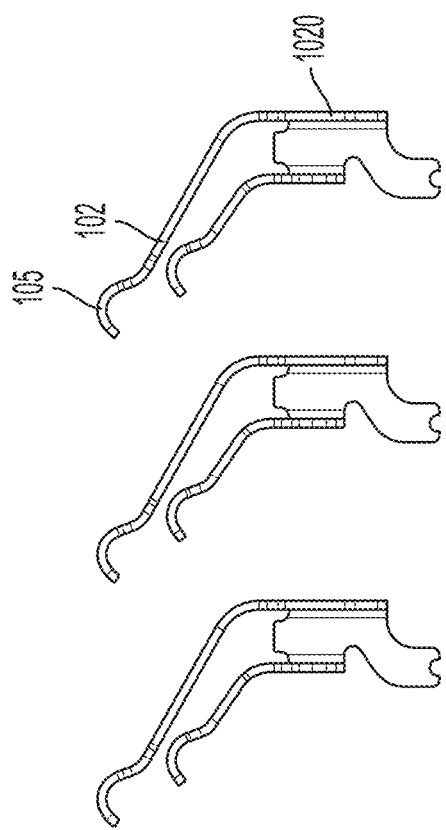

In the fabrication step leading to the state shown in FIG. 5D, beam 104 (including base portion 1040) is further bent. Here, bending of beam 104 involves folding base portion 1040 away from the plane of the page by approximately 90° with respect to a line parallel to the z-axis. Once folded, base portion 1040 extends primarily in an yz-plane. In the fabrication step leading to the state shown in FIG. 5E, beam 102 (including base portion 1020) is further bent. Here, bending of beam 102 involves folding base portion 1020 into the plane of the page by approximately 90° with respect to another line parallel to the z-axis. Once bent, base portion 1020 also extends primarily in an yz-plane. In some embodiments, a strap (not shown in FIG. 5E) may be used to connect base portion 1020 and base portion 1040. Such a strap, for example, may extend from one of base portion 1020 and base portion 1040 and contact the other of base portion 1020 or base portion 1040.

Figure 6B:
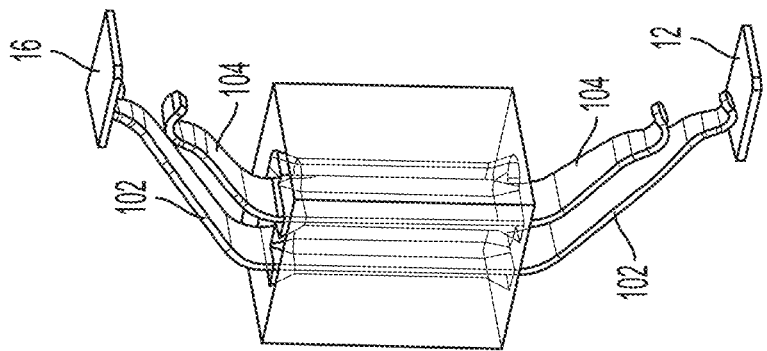
FIGS. 6A-6B are perspective views of a contact including a mounting portion and a contact including two pairs of compliant beams, respectively, in accordance with some embodiments.
Figure 6A:
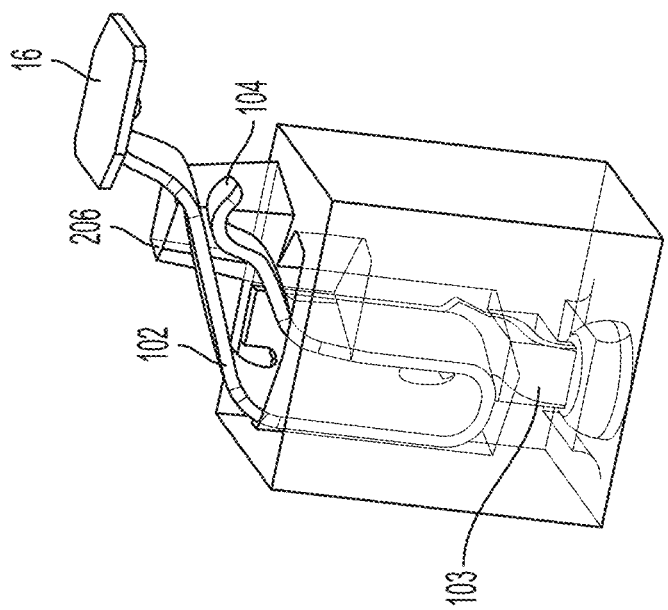

In the examples described above, contacts 100 include mounting portions defined for connection with substrate 14, via pad 12. In other embodiments, however, connection of contacts 100 to substrate 14 may be achieved via compression, similar to how contacts 100 connect to component 18. FIG. 6A illustrates an embodiment in which a contact 100 includes a mounting portion 103, while FIG. 6B illustrates an embodiment configured for dual compression—a pair of compliant beams 102/104 produces a spring force against pad 16 and another pair of compliant beams 102/104 produces a spring force against pad 12. The contact of FIG. 6B may be constructed as a unitary piece. As such, an intermediate portion 101 (not visible in FIG. 6B) may connect the beams together. Alternatively, the beams may be formed as separate pieces. For example, upper outer beam 102 may be connected to lower outer beam 102, and separately, upper inner beam 104 may be connected to lower inner beam 104. The inner beams and outer beams may nonetheless be electrically connected when compressed such that the inner beam 104 provides a shorter conductive path between pads 16 and 12 than outer beam 102.

In the example of FIG. 6A, solder or other fusible material may be attached to the contact after it is inserted into insulator 200. Likewise, elements of the structure of FIG. 6B may be formed after insertion of the contacts into an insulator. Concave portions, for example, may be formed after insertion. Alternatively, or additionally, insulator may be molded over the contacts to lock them in place, without requiring insertion into a preformed insulator.

Figure 7:
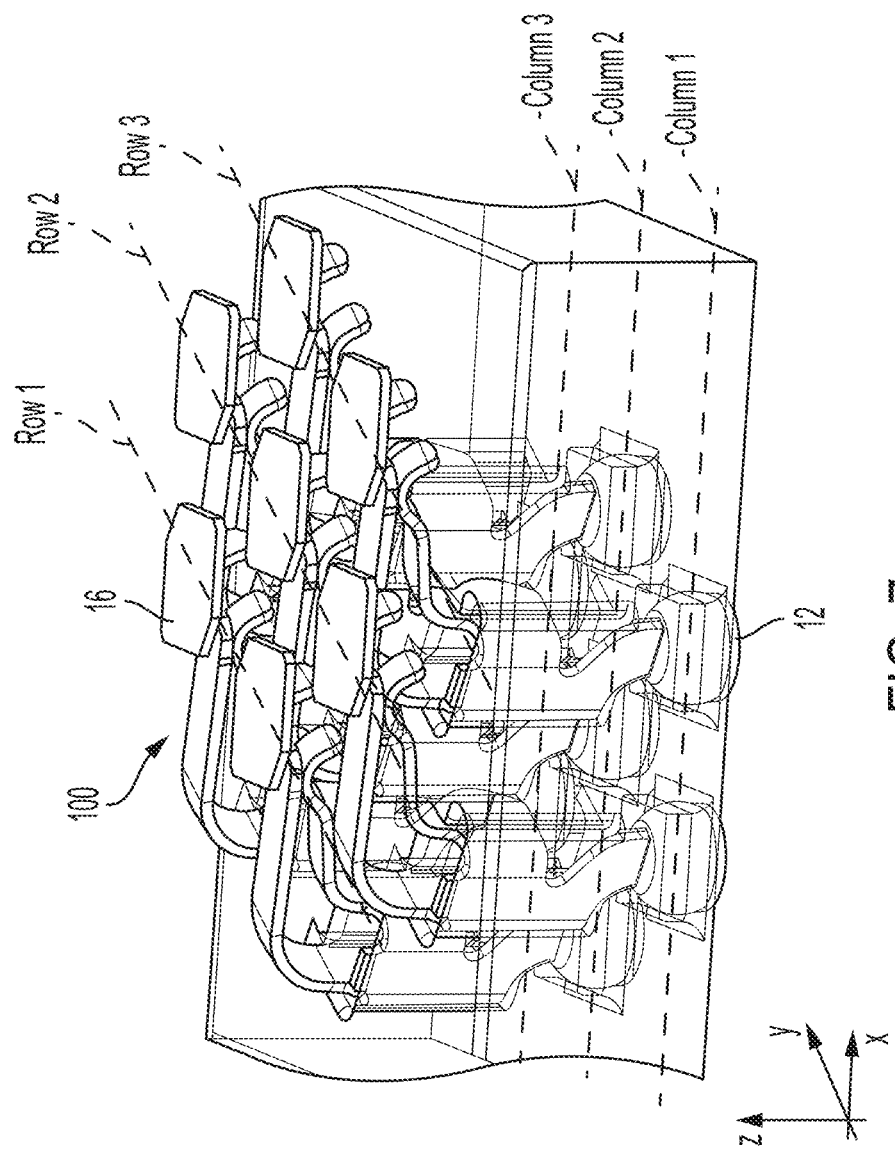
FIG. 7 is a perspective view of an array of contacts, in accordance with some embodiments.

FIG. 7 is a perspective view illustrating an array of contacts 100 arranged in rows (row 1, row 2 and row 3, in this example), in accordance with some embodiments. In this depiction, contacts 100 include mounting portions configured for connection to substrate 14 that are disposed in columns (column 1, column 2 and column 3, in this example). In this example, the rows and columns are transverse, but not orthogonal. The row direction is at an angle between 45 and 90 degrees with respect to the column direction, such as between 50 and 90 degrees. Orienting the contacts in this way enables a high density of contacts within the interposer. For example, in some embodiments, the separation 701 between adjacent rows may be between 0.7 mm and 0.9 mm, between 0.5 mm and 1.1 mm, between 0.7 mm and 1.1 mm, or between 0.5 mm and 0.9 mm. In some embodiments, the separation 702 between adjacent columns may be between 0.4 mm and 0.6 mm, between 0.3 mm and 0.7 mm, between 0.4 mm and 0.7 mm or between 0.3 mm and 0.6 mm.

Figure 8A:
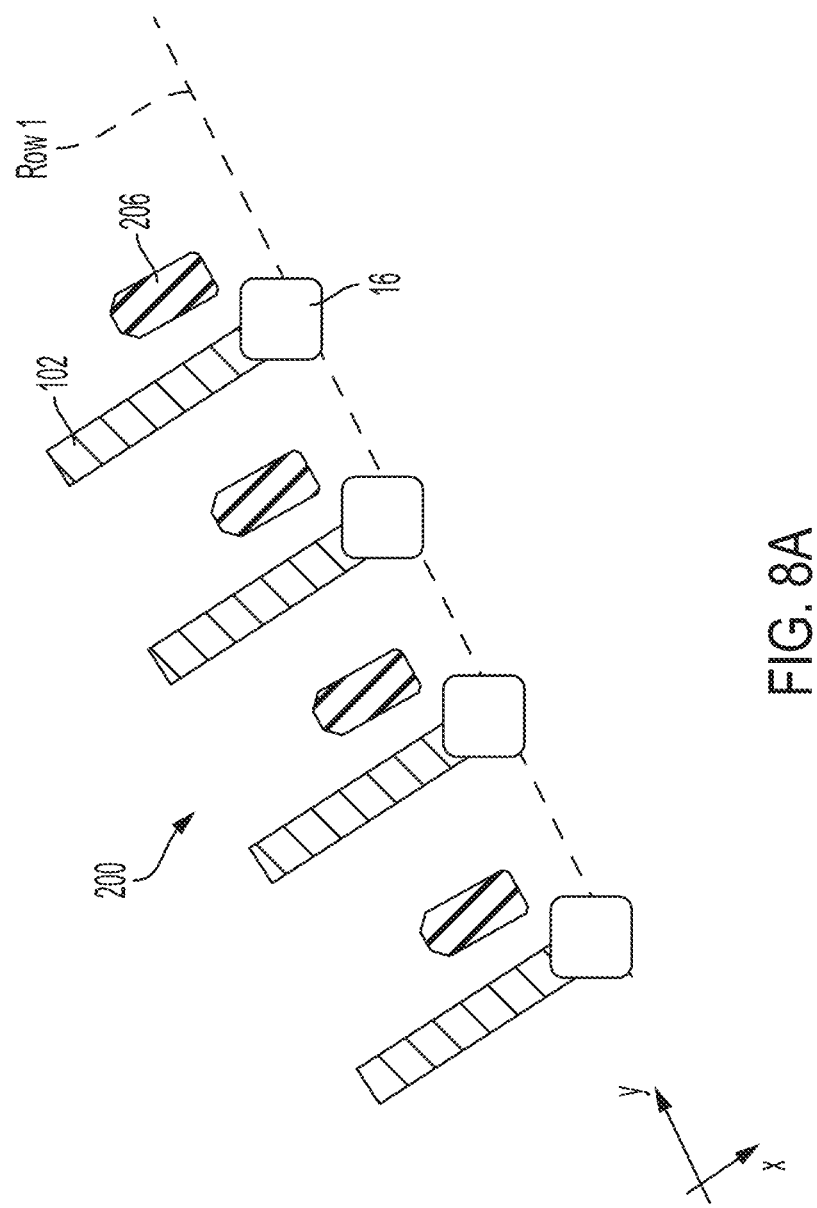
FIGS. 8A-8C are top plan views of a portion of the array of FIG. 7, in accordance with some embodiments.

FIG. 8A is a top view of an interposer 10 illustrating some of the contacts of row 1, in accordance with some embodiments. In this depiction, outer beams 102 are in contact with respective pads 16. Further, a row of projections 206 is illustrated. Each projection is positioned adjacent a respective beam. In some embodiments, the projections positioned adjacent the ground contacts may be filled with conducive or lossy material, while the projections positioned adjacent the signal contacts may not be filled with such a material.

Figure 8B:
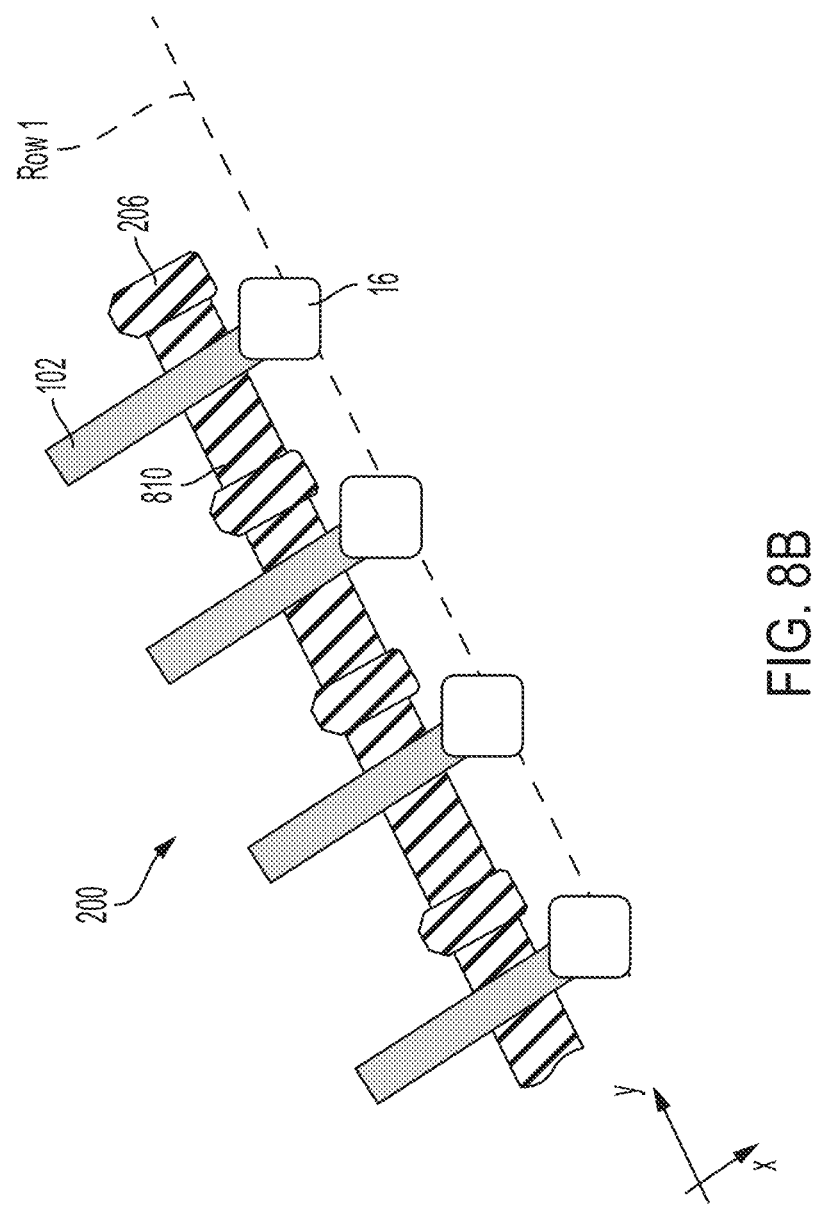

Further, conductive or lossy material may be embedded in or attached to insulative member 200 in locations instead of or in addition to projections 206. FIG. 8B shows a configuration of a row in which multiple adjacent contacts are configured as ground contacts. In this example, each of the projections 206 adjacent a ground contact is made of a lossy material. Additionally, regions of conductive or lossy material may be integrated into insulative member 200 in a location where they will couple to inner beam 104 when a component is pressed into the interposer. In this example, a strip 810 is shown extending parallel to the row direction. Strip 810 may be a metal strip, which may be insert molded in insulative member 200, as one example, or may be conductive plating on insulative member 200, as another example.

Alternatively, or additionally, strip 810 may be a lossy material, which may be injected as a second molding shot into insulative member 200, for example. In other configurations, strip 810 may be present and projections 206 may be insulative. As yet a further alternative, strip 810 may be a combination of metal and lossy material. The metal, for example, may extend into holes 204 where beams 104 will make contact with the metal when deflected.

The configuration shown in FIG. 8B may be employed in each row of an interposer designated for use as ground contacts. In other rows containing contacts designated as signal conductors, the projections 206 may be insulative and strip 810 may be omitted.

Figure 8C:
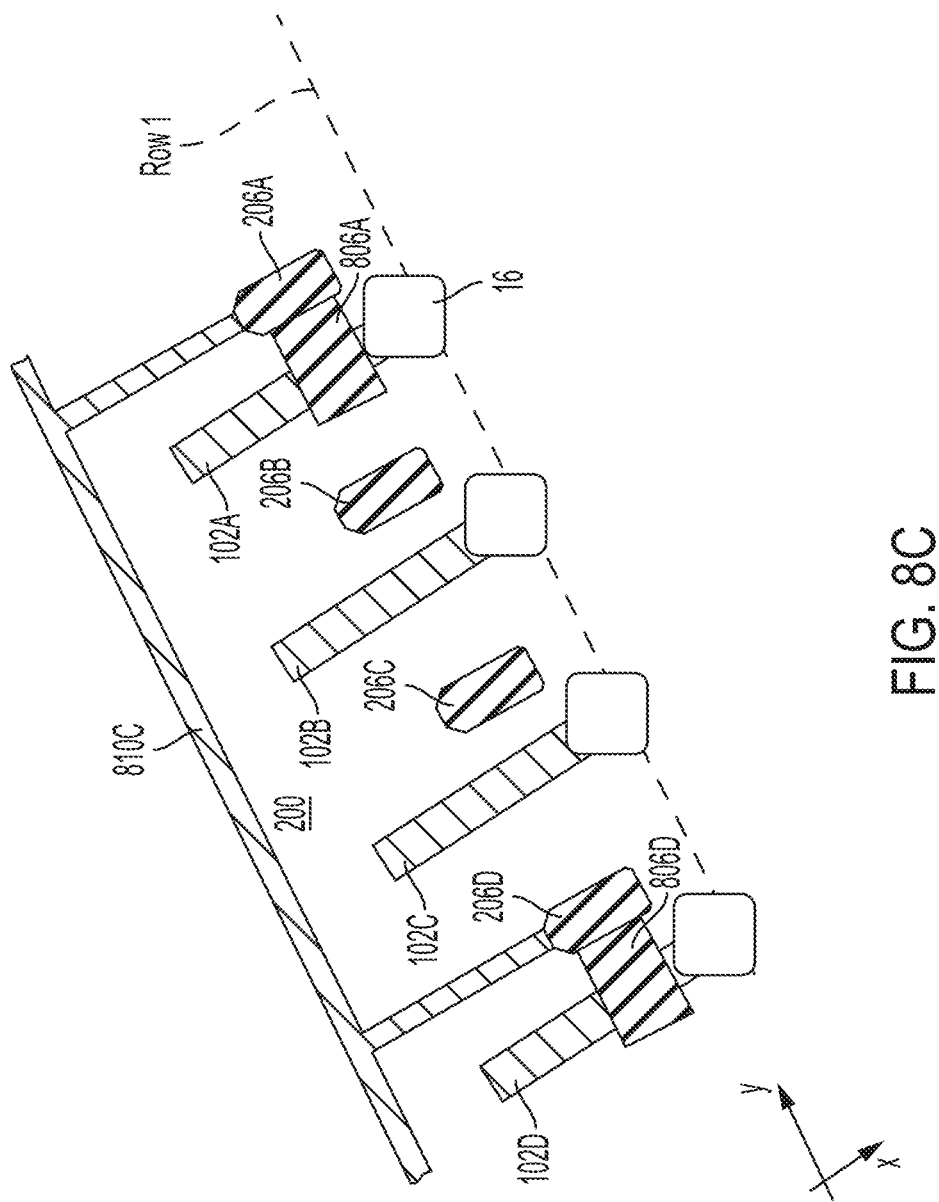

FIG. 8C shows a configuration in which some of the contacts within a row are designated as grounds and others are designated for carrying signals. In this example, beams 102A and 102D are portions of contacts designated as grounds, and beams 102B and 102C are designated as signals. Projections 206B and 206C, adjacent the signal contacts, may be insulative. Projections 206A and 206D optionally may be lossy.

In the example, of FIG. 8C, the interposer has a strip 810C. As with strip 810, strip 810C may be lossy material, or may be conductive, such as a metal sheet or metal plating, and/or may be a combination of such materials. In this example, regions 806A and 806D are positioned for coupling to beams of the ground contacts, which may be achieved using any of the techniques as described above. Regions 806A and 806D may each be electrically connected to strip 810C such that the regions 806A and 806D are coupled through strip 810C.

The configurations illustrated in FIGS. 8A-8C are believed to improve high frequency performance of an interposer, as described herein.

These techniques may be used separately or together, in any suitable combination. They may be used in interposers (e.g., sockets) or in any suitable application.

Having thus described several embodiments, it is to be appreciated various alterations, modifications, and improvements may readily occur to those skilled in the art. Such alterations, modifications, and improvements are intended to be within the spirit and scope of the invention.

For example, some contacts are described as signal contacts or ground contacts. These contacts may be differentiated based on shape, with the ground contacts being wider than signal contacts of some or all of their length. Alternatively, they may be differentiated by position, with signal contacts being positioned in pairs between ground contacts, for example in a ground, signal, signal, ground (GSSG) pattern, where adjacent signal contacts form a differential pair. Alternatively, the contacts may be arranged in a signal, ground, signal (SGS) pattern. The ground contacts may electrically connect to a ground plane of substrate 14.

Embodiments have been described in which a higher spring constant may be obtained as a result of the inner beam being shorter than the outer beam. A spring constant could be adjusted in other ways, such as by a wider beam, a thinner beam, or holes through the beam, for example.

Further embodiments have been described in which a shorter electrical path to the mounting portion may be obtained through an additional (inner) beam. Shorter electrical paths might be made in other ways, such as a central portion of the inner beam contacting a central portion of the outer beam.

A chip socket has been described as an example of an interposer. Techniques as described herein may be used to construct an interposer used for any suitable purpose, such as to join two parallel printed circuit boards. Similarly, a printed circuit board was used as an example of a substrate with conductive structures to be connected to another device through an interposer. Techniques as described herein may be used to connect any suitable substrate to another device.

Further, exemplary materials were described for portions of the interposer. Other materials may be used.

In some configurations, a semiconductor device with a Ball Grid Array or Land Grid Array may be connected to a PCB through the interposer. Alternatively, or additionally, the component may be the end of a flexible printed circuit. Accordingly, it should be appreciated that a component with a substrate having contact pads thereon may be pressed against the interposer to make electrical connections.

In some embodiments, a compressive force is applied to an interposer as a result of a lid being closed with some mechanism to bias the lid towards the interposer. That mechanism may include spring-like members with camming surfaces formed as part of the frame, for example. Similar spring-like members may be formed as part of a sheet-metal shell surrounding the frame and/or the interposer.

Terms signifying direction, such as "upwards" and "downwards," were used in connection with some embodiments. These terms were used to signify direction based on the orientation of components illustrated or connection to another component, such as a surface of a printed circuit board to which a termination assembly is mounted. It should be understood that electronic components may be used in any suitable orientation. Accordingly, terms of direction should be understood to be relative, rather than fixed to a coordinate system perceived as unchanging, such as the earth's surface.

Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A contact for an interposer, the contact comprising:
an intermediate portion elongated in a first direction; and
a plurality of beams coupled to the intermediate portion, wherein:
each of the plurality of beams is elongated in a direction transverse to the first direction;

a first beam of the plurality of beams comprises a first contact surface facing in the first direction;

a second beam of the plurality of beams comprises a second contact surface facing in the first direction; and the first beam and the second beam are in a plane parallel to the first direction with the second contact surface within the working range of the first beam such that the first beam is adapted to contact the second beam upon deflection of the first beam, and wherein the first and second beams have pivot points offset from one another in the direction transverse to the first direction such that further deflection of the first beam causes the second beam to slide against the first beam.

2. The contact for an interposer of claim 1, wherein: the first contact surface is separated from the second contact surface by a distance along the first beam between 10% and 50% of the length of the first beam.

3. The contact for an interposer of claim 1, wherein: the first beam is between 110% and 200% of the length of the second beam.

4. The contact for an interposer of claim 1, wherein: the second beam has a spring constant between 110% and 200% of the spring constant of the first beam.

5. The contact for an interposer of claim 1, further comprising a mounting portion extending from the intermediate portion in a second direction opposite the first direction.

6. The contact for an interposer of claim 5, wherein: the contact comprises a bent sheet of metal; and the mounting portion comprises an edge of the sheet of metal with a notch.

7. The contact for an interposer of claim 1, wherein: the intermediate portion has a first side and a second opposite side;
the contact further comprises:
  a first base portion perpendicular to the intermediate portion at the first side; and
  a second base portion perpendicular to the intermediate portion at the second side;
the first beam extends from the first base portion; and
the second beam extends from the second base portion.

8. The contact for an interposer of claim 7, wherein: the first base portion is attached to the first side of the intermediate portion; and
the second base portion is attached to the second side of the intermediate portion.

9. The contact for an interposer of claim 7, further comprising:
a strap connecting the first base portion and the second base portion.

10. The contact for an interposer of claim 9, wherein: the first base portion is attached to the first side of the intermediate portion.

11. The contact for an interposer of claim 1, wherein: the first contact surface comprises a convex surface of a curved portion of the first beam; and
the second contact surface comprises a convex surface of a curved portion of the second beam.

12. The contact for an interposer of claim 1, wherein: a third beam of the plurality of beams comprises a third contact surface facing in a second direction opposite the first direction;
a fourth beam of the plurality of beams comprises a fourth contact surface facing in the second direction; and the fourth contact surface is within the working range of the third beam such that the third beam is adapted to contact the fourth beam upon deflection of the third beam.

13. An interposer comprising:
an insulative member comprising a first surface and a second, opposite surface; and
a plurality of contacts comprising ends exposed at the first surface and mating portions exposed at the second surface,
wherein:
  the mating portion of each of the plurality of contacts comprise a plurality of beams,
  a first beam of the plurality of beams comprises a contact surface facing in a first direction perpendicular to the second surface and a second surface of the first beam, facing opposite the contact surface, wherein the first beam is adapted to deflect about a first pivot point;
  a second beam of the plurality of beams aligned with the first beam in the first direction and disposed between the first beam and the insulative member; and
  compression of the first beam beyond an amount at which the first beam contacts the second beam causes the second beam to deflect about a second pivot point that is offset from the first pivot point in a second direction perpendicular to the first direction, wherein causing the second beam to deflect about the second pivot point comprises causing the second beam to slide against the first beam.

14. The interposer of claim 13, wherein:
the ends of the plurality of contacts are disposed in a first array;
the mating portions of the plurality of contacts are disposed in a second array;
the second array is offset from the first array in a second direction parallel to the first surface.

15. The interposer of claim 13, wherein:
the plurality of contacts comprise intermediate portions connecting the ends and the mating portions; and
the insulative member comprises a plurality of holes extending from the first surface to the second surface;
the intermediate portions of the plurality of contacts are disposed within the holes; and
the insulative member comprises a plurality of openings in the first surface, wherein the openings open into the holes and are configured to receive respective second beams when the second beams are deflected towards the insulative member.

16. The interposer of claim 13, wherein:
the insulative member comprises a plurality of projections projecting from the second surface adjacent mating portions of at least a portion of the plurality of contacts.

17. The interposer of claim 16, wherein:
the plurality of projections adjacent the portion of the plurality of contacts comprise lossy material.

18. The interposer of claim 13, further comprising:
a conductive member positioned to contact a portion of the plurality of contacts when the mating portions of the portion of the plurality of contacts are in at least one of a compressed or uncompressed state.

19. The interposer of claim 13, wherein:
the mating portions are exposed at the second surface in a plurality of rows; and the interposer further comprises a conductive strip comprising a first portion, elongated parallel to a row and a plurality of tabs; and each of the plurality of tabs extends towards a mating portion of a contact.

20. The interposer of claim 13, wherein the first beam is between 110% and 200% of the length of the second beam.

\* \* \* \* \*